(12) United States Patent
Shimizu et al.

(10) Patent No.: US 8,384,055 B2
(45) Date of Patent: Feb. 26, 2013

(54) OUTPUT CIRCUIT, LIGHT-RECEIVER CIRCUIT USING THE SAME, AND PHOTOCOUPLER

(75) Inventors: Masafumi Shimizu, Shiga (JP); Satoshi Yoshimura, Shiga (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 309 days.

(21) Appl. No.: 12/923,959

(22) Filed: Oct. 18, 2010

(65) Prior Publication Data

US 2011/0101256 A1 May 5, 2011

(30) Foreign Application Priority Data

Oct. 30, 2009 (JP) .................................. 2009-250107

(51) Int. Cl.
*H01L 31/167* (2006.01)

(52) U.S. Cl. .................. 250/551; 323/280; 330/261

(58) Field of Classification Search .................. 250/551; 330/9, 51, 252–261; 323/273–280
See application file for complete search history.

(56) References Cited

U.S. PATENT DOCUMENTS

| | | | |
|---|---|---|---|
| 5,410,270 A * | 4/1995 | Rybicki et al. ..................... 330/9 |
| 6,456,555 B2 * | 9/2002 | Sim et al. ....................... 365/226 |
| 7,505,521 B2 * | 3/2009 | Cho et al. ....................... 375/257 |
| 7,649,403 B2 * | 1/2010 | Lee et al. ....................... 327/536 |
| 7,973,521 B2 * | 7/2011 | Chen et al. ..................... 323/273 |
| 2001/0053097 A1 * | 12/2001 | Sim et al. .................. 365/189.09 |
| 2005/0089106 A1 * | 4/2005 | Cho et al. ....................... 375/257 |
| 2006/0244517 A1 * | 11/2006 | Lee et al. ....................... 327/536 |
| 2010/0033144 A1 * | 2/2010 | Chen et al. ..................... 323/280 |
| 2010/0073078 A1 * | 3/2010 | Lee et al. ....................... 327/536 |

FOREIGN PATENT DOCUMENTS

JP      2-5612 A      1/1990

* cited by examiner

*Primary Examiner* — Seung C Sohn
(74) *Attorney, Agent, or Firm* — McGinn IP Law Group, PLLC

(57) ABSTRACT

An output circuit includes a bias circuit that operates when a power supply voltage equal to or larger than a predetermined voltage is applied, a differential amplifier circuit that outputs signals according to input differential signals upon receiving a bias current or bias voltage generated when the bias circuit is operated, an output stage circuit that receives differential signals according to an output from the differential amplifier circuit and outputs output signals according to the differential signals, the output stage circuit having fewer number of stages of elements connected in series than the bias circuit, and a pull-down circuit that forcibly sets a level of one of the differential signals received by the output stage circuit to a ground voltage to fix the level of the output signals output from the output stage circuit when the bias current or the bias voltage generated by the bias circuit is not supplied.

13 Claims, 8 Drawing Sheets

US 8,384,055 B2

OUTPUT CIRCUIT, LIGHT-RECEIVER CIRCUIT USING THE SAME, AND PHOTOCOUPLER

INCORPORATION BY REFERENCE

This application is based upon and claims the benefit of priority from Japanese patent application No. 2009-250107, filed on Oct. 30, 2009, the disclosure of which is incorporated herein in its entirety by reference.

BACKGROUND

1. Field of the Invention

The present invention relates to an output circuit, a light-receiver circuit using the same, and a photocoupler.

2. Description of Related Art

An output circuit that outputs digital signals using a totem-pole output circuit is formed of two-stage or three-stage transistors. Further, a circuit provided at a former stage of the output circuit, e.g., a comparator, a differential amplifier, is formed of four-stage or five-stage transistors to cope with high-speed operation. Furthermore, a bias circuit that drives these circuits needs to be formed of an equal or larger number of stages of transistors.

In the middle of start-up of a power supply voltage, the output circuit having fewer number of stages of transistors firstly starts up. However, the comparator, the differential amplifier, the bias circuit and so on that are located at the former stages require high rising voltage. The output circuit can be normally controlled only after the former-stage circuits start up. This makes the output from the output circuit unstable. This means that an unstable signal is supplied to a circuit located at the subsequent stage connected to an output terminal of the output circuit. Thus, the unstable output from the output circuit may cause malfunction in the subsequent circuit, and may cause destruction of the subsequent circuit in the worst case. To prevent such problems, it is necessary to stabilize the output voltage from the output circuit until when the power supply voltage sufficiently increases to allow all the circuits to perform normal operations.

In manufacturing such a stable circuit by ICs, the circuit is preferably manufactured by a small number of manufacturing processes for the purpose of reducing the cost. Active elements are preferably composed of only NPN transistors without using PNP transistors.

FIG. 6 shows a configuration of an output circuit 1 according to a related art. However, only NPN transistors are used as active elements used in the output circuit 1 in FIG. 6 for the reason noted above, and the output circuit 1 has a configuration of a totem-pole output circuit.

As shown in FIG. 6, the output circuit 1 includes a bias circuit 10, a differential amplifier 20, a comparator 30, and an output stage circuit 40.

The bias circuit 10 includes NPN transistors Q11 to Q14, resistors R11 to R14, and diodes D11 to D13.

The NPN transistor Q11 has a collector connected to a power supply voltage VCC, an emitter connected to a node N11, and a base connected to a node N12. The diodes D11 to D13 are connected in series between the node N11 and a node N13. The resistor R12 has one end connected to the node N13, and the other end connected to a node N14. The resistor R13 has one end connected to the node N15. N13, and the other end connected to a node N15. The NPN transistor Q12 has a collector connected to the node N14, an emitter connected to a node N16, and a base connected to the node N15. The NPN transistor Q13 has a collector and a base connected to the node N15, and an emitter connected to a ground terminal GND. The resistor R14 has one end connected to the node N16, and the other end connected to the ground terminal GND. The resistor R11 has one end connected to the power supply voltage VCC, and the other end connected to the node N12. The NPN transistor Q14 has a collector connected to the node N12, an emitter connected to the ground terminal GND, and a base connected to the node N14.

The differential amplifier 20 includes NPN transistors Q21 to Q28, resistors R21 to R23, and a diode D21. The resistor R21 has one end connected to the power supply terminal VCC, and the other end connected to a node N21. The resistor R22 has one end connected to the power supply terminal VCC, and the other end connected to a node N22. The NPN transistor Q21 has a collector and a base connected to the node N21, and an emitter connected to the node N22.

The NPN transistor Q22 has a collector connected to the node N21, an emitter connected to a node N23, and a base connected to a node N26. The NPN transistor Q23 has a collector connected to the node N22, an emitter connected to a node N24, and a base connected to the node N26. The NPN transistor Q24 has a collector connected to the node N23, an emitter connected to a node N25, and a base connected to a differential input terminal VIN1. The NPN transistor Q25 has a collector connected to the node N24, an emitter connected to the node N25, and a base connected to a differential input terminal VIN2.

The NPN transistor Q26 has a collector connected to the power supply terminal VCC, an emitter connected to the node N26, and a base connected to the node N12. The diode D21 has an anode connected to the node N26, and a cathode connected to a node N27. The resistor R23 has one end connected to the node N27, and the other end connected to a node N28. The NPN transistor Q27 has a collector and a base connected to the node N28, and an emitter connected to the ground terminal GND. The NPN transistor Q28 has a collector connected to the node N28, an emitter connected to the ground terminal GND, and a base connected to the node N28.

The comparator 30 has one input terminal CIN1 connected to the node N22, and the other input terminal CIN2 connected to the node N21. Further, the comparator 30 outputs an inversion output with respect to the input of the input terminal CIN1 from an output terminal COUT1, and outputs an inversion output with respect to the input of the input terminal CIN2 from an output terminal COUT2.

The output stage circuit 40 includes NPN transistors Q41 to Q45, resistors R41 and R42, and a diode D41. The NPN transistor Q42 has a collector connected to the power supply terminal VCC, an emitter connected to a node N41, and a base connected to the output terminal COUT2 of the comparator 30. The resistor R41 has one end connected to the node N41, and the other end connected to the ground terminal GND. The resistor R42 has one end connected to the power supply terminal VCC, and the other end connected to a node N42.

The NPN transistor Q41 has a collector connected to the node N42, an emitter connected to a node N43, and a base connected to the output terminal COUT1 of the comparator 30. The NPN transistor Q43 has a collector connected to the node N43, an emitter connected to the ground terminal GND, and a base connected to the node N41. The NPN transistor Q44 has a collector connected to the power supply terminal VCC, an emitter connected to a node N44, and a base connected to the node N42. The diode D41 has an anode connected to the node N44, and a cathode connected to the output terminal VOUT. The NPN transistor Q45 has a collector connected to an output terminal VOUT, an emitter connected to the ground terminal GND, and a base connected to the node N43.

Hereinafter, an operation of the output circuit 1 will be described. First, an operation of the bias circuit 10 will be described. The NPN transistors Q12 to Q14 and the resistors R12 to R14 constitute a bandgap circuit. By setting the voltage of the node N13 to a certain voltage (Vref), a base voltage VbQ11 of the NPN transistor Q11 is determined by a base-emitter voltage VbeQ11 of the NPN transistor Q11 and the diodes D11 to D13 that are connected in series in the forward direction. Specifically, the base voltage VbQ11 is the value expressed by the following expression.

$$VbQ11 = Vref + (3 \times Vf) + VbeQ11 = Vref + (4 \times Vf)$$

The symbol Vf denotes a forward voltage of a diode, and also corresponds to a base-emitter voltage Vbe of the NPN transistor Q11. The base-emitter voltage of any other NPN transistor also corresponds to Vf.

In the differential amplifier 20, the NPN transistors Q22 and Q23 together with the NPN transistors Q24 and Q25 that form a differential pair form a cascode connection, and each base of the NPN transistors Q22 and Q23 is connected to the node N26. Further, the NPN transistor Q21 is connected between the nodes N21 and N22. According to this configuration, the amplitude of the output of the differential amplifier 20, which is the input of the comparator 30 is limited, thereby achieving a high-speed operation in the differential amplifier 20.

Since the NPN transistors Q26 and Q11 have the common base, a base voltage VbQ26 of the NPN transistor Q26 is equal to the base voltage VbQ11 of the NPN transistor Q11. When a base-emitter voltage of the NPN transistor Q26 is denoted by VbeQ26 and the base voltages of the NPN transistors Q22 and Q23 are respectively denoted by VbQ22 and VbQ23, the following expression is satisfied.

$$VbQ22 = VbQ23 = VbQ26 - VbeQ26 =$$
$$VbQ11 - VbeQ11 = Vref + (4 \times Vf) - Vf = Vref + (3 \times Vf)$$

Thus, the voltage of the NPN transistors Q22 and Q23, which is the voltage of the node N26 is fixed to Vref+(3×Vf).

Further, a current IcQ27, which is the current flowing in a current path in which the NPN transistor Q26, the diode D21, the resistor R23, and the NPN transistor Q27 are connected in series, is determined by the following expression.

$$IcQ27 = (Vref + Vf)/R23$$

The NPN transistors Q27 and Q28 constitute a current mirror. Thus, a constant current Io in accordance with the mirror ratio of the NPN transistor Q27 to the NPN transistor Q28 flows as the operational current of the differential pair transistors Q24 and Q25 with respect to the current IcQ27. The symbol attached to the resistor R23 also indicates the resistance value of the resistor. The symbols attached to other resistors also indicate the resistance values of the respective resistors.

The voltages supplied to the input terminals Vin1 and Vin2 are denoted by V1 and V2, respectively. When V1>V2, the NPN transistor Q24 is ON, and the NPN transistor Q25 is OFF. Thus, the voltages of the nodes N22 and N21 that are outputs of the differential amplifier 20, or voltages VCIN1 and VCIN2 of the input terminals CIN1 and CIN2 of the comparator 30 are as follows.

$$VCIN1 = VCC - R21 \times Io$$

$$VCIN2 = VCC$$

Thus, VCIN1<VCIN2 is satisfied. As described above, inversion outputs of the input terminals CIN1 and CIN2 are output from the output terminals COUT1 and COUT2 of the comparator 30, respectively. Thus, when output voltages of the output terminals COUT1 and COUT2 are denoted by VCOUT1 and VCOUT2, respectively, VCOUT1>VCOUT2 is satisfied. In summary, the high-level signal is output from the output terminal COUT1 of the comparator 30, and the low-level signal is output from the output terminal COUT2 thereof.

Since the high-level signal is output from the output terminal COUT1, the NPN transistor Q41 is ON in the output stage circuit 40. Further, since the NPN transistor Q41 is ON, the voltage of the node N41 increases and the NPN transistor Q43 is ON. Further, since the NPN transistor Q43 is ON, the voltage of the node N43 decreases and the NPN transistor Q45 (low-side transistor) is OFF.

On the other hand, the low-level signal is output from the output terminal COUT2. Thus, the NPN transistor Q42 is OFF, the voltage of the node N42 reaches the power supply voltage VCC, and the NPN transistor Q44 (high-side transistor) is ON. Accordingly, the NPN transistor Q45 (low-side transistor) is OFF, the NPN transistor Q44 (high-side transistor) is ON, and the voltage of the output terminal VOUT is in the high level.

On the other hand, when V1<V2, the NPN transistor Q24 is OFF, and the NPN transistor Q25 is ON. Accordingly, the voltages VCIN1 and VCIN2 of the input terminals CIN1 and CIN2 of the comparator 30 are as follows.

$$VCIN1 = VCC$$

$$VCIN2 = VCC - R22 \times Io$$

Thus, VCIN1>VCIN2 is satisfied. The inversion outputs of the input terminals CIN1 and CIN2 are output from the output terminals COUT1 and COUT2 of the comparator 30, respectively, where VCOUT1<VCOUT2 is satisfied. In short, the low-level signal is output from the output terminal COUT1 of the comparator 30 and the high-level signal is output from the output terminal COUT2 thereof.

Since the low-level signal is output from the output terminal COUT1, the NPN transistor Q41 is OFF, the voltage of the node N41 drops to the ground voltage GND, which turns off the NPN transistor Q43 in the output stage circuit 40. Since the NPN transistor Q43 is OFF, the voltage of the node N43 increases, which turns on the NPN transistor Q45 (low-side transistor).

On the other hand, since the high-level signal is output from the output terminal COUT2, the NPN transistor Q42 is ON, the voltage of the node N42 decreases, and the NPN transistor Q44 (high-side transistor) is OFF. Accordingly, the NPN transistor Q45 (low-side transistor) is ON, the NPN transistor Q44 (high-side transistor) is OFF, and the voltage of the output terminal VOUT is made low.

SUMMARY

In the output circuit 1 according to the related art, the power supply voltage VCC of the following voltage is necessary at least in order to normally operate the bias circuit 10.

$$VCC \geq Vref + (4 \times Vf)$$

In general, when Vref=1 V and Vf=0.6 V, VCC≧3.4 V is satisfied, and the bias circuit 10 does not operate in a voltage lower than this voltage. Thus, the differential amplifier 20 and the comparator 30 are not supplied with the constant current, which makes each output of the comparator 30 high-impedance state and causes unstable voltage. Then, the output stage circuit 40 having fewer number of stages of transistors starts up, and the output stage circuit 40 outputs the unstable signal to a circuit located at the subsequent stage connected to the output terminal Vout due to this unstable input.

Thus, if the subsequent circuit is in the middle of start-up as is similar to the output circuit 1 or the subsequent circuit can perform low-voltage operation, the subsequent circuit may receive the unstable signal from the output terminal Vout and this may cause malfunction in the subsequent circuit. In the worst case, the subsequent circuit may be destroyed. Hence, in the middle of start-up before the voltage reaches the power supply voltage with which the output circuit 1 can normally operate, the output signal needs to be forcibly fixed to the low level or the high level.

In order to cope with such a problem, a configuration of a prior art including a pull-down circuit to fix the output of the totem-pole-type output stage circuit when starting up with power supply is disclosed in Japanese Unexamined Patent Application Publication No. 2-5612. FIGS. 7 and 8 show the configuration of output circuits 2 and 3 of the prior art including pull-down circuits 50 and 60 of Japanese Unexamined Patent Application Publication No. 2-5612. The pull-down circuits 50 and 60 fix the output voltage until when the power supply voltage VCC reaches a certain voltage Vs in the start-up.

It is assumed, in the output circuits 2 and 3, that the certain voltage Vs is set to a value higher than 2Vbe+Vf. However, in reality, when the power supply voltage VCC exceeds the lowest voltage that guarantees the operation (which is the lowest value VCCmin of the recommended operation voltage), the circuit is fixed to the low level within the recommended operation voltage, and the output circuits 2 and 3 are not operated. The range of Vs is 2Vbe+Vf<Vs<VCCmin.

In the pull-down circuit 50 shown in FIG. 7, the voltage Vs that turns off the NPN transistor Q51 corresponds to VCC determined by the expression (VCC−Vf)×R51/(R51+R53) =VbeQ52 when the base voltage of the NPN transistor Q52 is 1 Vf. Thus, Vs satisfies the following expression.

$$Vs = VbeQ52 \times ((R51+R53)/R51) + Vf \quad (1)$$

In the expression (1), Vf denotes a forward voltage of the diode D51.

The operation of the pull-down circuit 50 has nothing to do with the circuit operation timing of the output circuit 2 except the pull-down circuit 50. Thus, the values of the resistor, the transistor, and the diode in the above expression (1) are independently determined regardless of the state of the signal level of the input IN. Thus, the certain voltage Vs may be 2Vbe+Vf or less or VCCmin or more depending on the ambient temperature of the circuit or manufacturing variations of devices. Because of this, the pull-down circuit 50 may operate even with the lowest power supply voltage or the pull-down circuit 50 may not operate with the voltage of VCC of the normal operation or less depending on the fluctuations of the ambient temperature or manufacturing variations. Thus, the output circuit 2 may also output the unstable signal as in the output circuit 1 stated above.

In a pull-down circuit 60 shown in FIG. 8, one end of a resistor R62 is connected to a base of an NPN transistor Q71. Therefore, an NPN transistor Q61 is always OFF when the input IN is in the low level, which does not influence on the operation of the output circuit 3.

On the other hand, when the input IN is in the high level, the NPN transistor Q61 is ON and the output is fixed to the high level. Now, the operational point (threshold voltage) of an NPN transistor Q62 that turns on/off the NPN transistor Q61 is 1 Vf of VbeQ62. On the other hand, the base voltage of the NPN transistor Q71 is 2 Vf of (VbeQ72+VbeQ71). The value obtained by dividing the voltage by the resistor R62 and a resistor R63 is applied to a base of the NPN transistor Q62. Hence, the deviation corresponding to 1 Vf may be generated by the temperature characteristics or manufacturing variations when the input IN is in the high level, and the failure as in the output circuit 2 described above may be generated.

A first exemplary aspect of an embodiment of the present invention is an output circuit including a bias circuit that operates when a power supply voltage equal to or larger than a predetermined voltage is applied, a differential amplifier circuit that outputs signals according to input differential signals upon receiving a bias current or a bias voltage generated when the bias circuit is operated, an output stage circuit that receives differential signals according to an output from the differential amplifier circuit and outputs output signals according to the differential signals, the output stage circuit having fewer number of stages of elements connected in series than the bias circuit, and a pull-down circuit that forcibly sets a level of one of the differential signals received by the output stage circuit to a ground voltage to fix the level of the output signals output from the output stage circuit when the bias current or the bias voltage generated by the bias circuit is not supplied.

The output circuit according to the present invention forcibly connects the level of the signal received by the output stage circuit to the ground to fix the level of the signal output from the output stage circuit even when the power supply voltage does not reach a predetermined voltage, the bias current or the bias voltage is not supplied from the bias circuit, and the differential amplifier circuit that is located at the former stage of the output stage circuit does not normally operate. Accordingly, it is possible to prevent the output stage circuit from outputting an unstable signal even when the output stage circuit having fewer number of stages of elements such as transistors than the bias circuit starts up earlier than the bias circuit.

The output circuit according to the present invention prevents the unstable signal from being output even when the power supply voltage is lower than a predetermined voltage, thereby increasing reliability of the circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
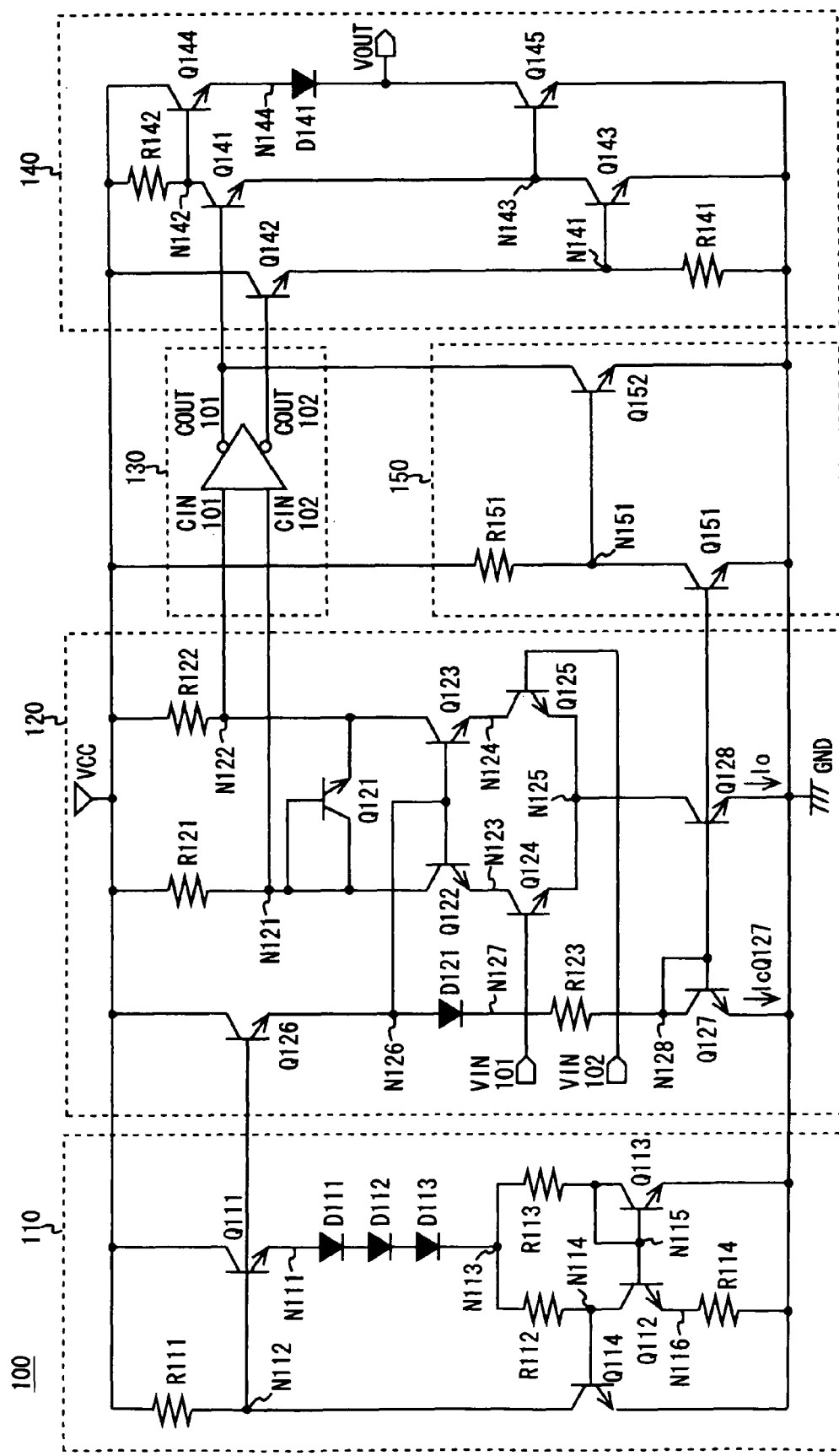
FIG. 1 shows a configuration of an output circuit according to a first exemplary embodiment.

Hereinafter, a first exemplary embodiment according to the present invention will be described in detail with reference to the drawing. The first exemplary embodiment applies the present invention to an output circuit 100. Preferably, the output circuit 100 is manufactured by a small number of manufacturing processes for the purpose of reducing the manufacturing cost for achieving IC. Thus, it is assumed that active elements are composed of only NPN transistors without using PNP transistors. However, this is only an example, and the IC may be composed of other elements than the NPN transistors as the active elements.

As shown in FIG. 1, the output circuit 100 includes a bias circuit 110, a differential amplifier 120, a comparator 130, an output stage circuit 140, and a pull-down circuit 150.

The bias circuit 110 includes NPN transistors Q111 to Q114, resistors R111 to R114, and diodes D111 to D113.

The NPN transistor Q111 has a collector connected to a power supply voltage VCC, an emitter connected to a node N111, and a base connected to a node N112. The diodes D111 to D113 are connected in series between the node N111 and a node N113. More specifically, an anode of the diode D111 is connected to the node N111, and a cathode thereof is connected to an anode of the diode D112. The anode of the diode D112 is connected to a cathode of the diode D111, and a cathode thereof is connected to an anode of the diode D113. The anode of the diode D113 is connected to the cathode of the diode D112, and a cathode thereof is connected to the node N113.

The resistor R112 has one end connected to the node N113, and the other end connected to a node N114. The resistor R113 has one end connected to the node N113, and the other end connected to a node N115. The NPN transistor Q112 has a collector connected to the node N114, an emitter connected to a node N116, and a base connected to the node N115. The NPN transistor Q113 has a collector and a base connected to the node N115, and an emitter connected to a ground terminal GND. The resistor R114 has one end connected to the node N116, and the other end connected to the ground terminal GND. The resistor R111 has one end connected to the power supply voltage VCC, and the other end connected to the node N112. The NPN transistor Q114 has a collector connected to the node N112, an emitter connected to the ground terminal GND, and a base connected to the node N114.

The differential amplifier 120 includes NPN transistors Q121 to Q128, resistors R121 to R123, and a diode D121. The resistor R121 has one end connected to the power supply terminal VCC, and the other end connected to a node N121. The resistor R122 has one end connected to the power supply terminal VCC, and the other end connected to a node N122. The NPN transistor Q121 has a collector and a base connected to the node N121, and an emitter connected to the node N122.

The NPN transistor Q122 has a collector connected to the node N121, an emitter connected to a node N123, and a base connected to a node N126. The NPN transistor Q123 has a collector connected to the node N122, an emitter connected to a node N124, and a base connected to the node N126. The NPN transistor Q124 has a collector connected to the node N123, an emitter connected to a node N125, and a base connected to a differential input terminal VIN101. The NPN transistor Q125 has a collector connected to the node N124, an emitter connected to the node N125, and a base connected to a differential input terminal VIN102.

The NPN transistor Q126 has a collector connected to the power supply terminal VCC, an emitter connected to the node N126, and a base connected to the node N112. The diode D121 has an anode connected to the node N126, and a cathode connected to a node N127. The resistor R123 has one end connected to the node N127, and the other end connected to a node N128. The NPN transistor Q127 has a collector and a base connected to the node N128, and an emitter connected to the ground terminal GND. The NPN transistor Q128 has a collector connected to the node N128, an emitter connected to the ground terminal GND, and a base connected to the node N128.

The differential amplifier 120 outputs differential signals according to input differential signals input to the differential input terminals VIN101 and VIN102. The nodes N121 and N122 correspond to output terminals of the differential amplifier 120. The resistor R121 and the NPN transistors Q122 and Q124 are a first current path, and the resistor R122 and the NPN transistors Q123 and Q125 are a second current path. The total current that flows in the first and second current paths depends on the current flowed by the NPN transistor Q128. Further, when the NPN transistor Q128 is OFF, the current does not flow in the first and second current paths and the operation of the differential amplifier 120 also stops.

The comparator 130 has one input terminal CIN101 connected to the node N122, and the other input terminal CIN102 connected to the node N121. Further, the comparator 130 outputs an inversion output with respect to the input of the input terminal CIN101 from an output terminal COUT101, and outputs an inversion output with respect to the input of the input terminal CIN102 from an output terminal COUT102.

The output stage circuit 140 includes NPN transistors Q141 to Q145, resistors R141 and R142, and a diode D141. The NPN transistor Q142 has a collector connected to the power supply terminal VCC, an emitter connected to a node N141, and a base connected to the output terminal COUT102 of the comparator 130. The resistor R141 has one end connected to the node N141, and the other end connected to the ground terminal GND. The resistor R142 has one end connected to the power supply terminal VCC, and the other end connected to a node N142.

The NPN transistor Q141 has a collector connected to the node N142, an emitter connected to a node N143, and a base connected to the output terminal COUT101 of the comparator 130. The NPN transistor Q143 has a collector connected to the node N143, an emitter connected to the ground terminal GND, and a base connected to the node N141.

The NPN transistor Q144 has a collector connected to the power supply terminal VCC, an emitter connected to a node N144, and a base connected to the node N142. The diode D141 has an anode connected to the node N144, and a cathode connected to an output terminal VOUT. The NPN transistor Q145 has a collector connected to the output terminal VOUT, an emitter connected to the ground terminal GND, and a base connected to the node N143.

The pull-down circuit 150 includes a resistor R151, and NPN transistors Q151 and Q152. The resistor R151 has one end connected to the power supply terminal VCC, and the other end connected to a node N151. The NPN transistor Q151 has a collector connected to the node N151, an emitter connected to the ground terminal GND, and a base connected to the node N128. The NPN transistor Q152 has a collector connected to the output terminal COUT102 of the comparator 130, an emitter connected to the ground terminal GND, and a base connected to the node N151.

Now, an operation of the output circuit 100 will be described. First, an operation of the bias circuit 110 will be described. The NPN transistors Q112 to Q114 and resistors R112 to R114 constitute a bandgap circuit. By setting the voltage of the node N113 to a certain voltage (Vref), a base voltage VbQ111 of the NPN transistor Q111 is determined by a base-emitter voltage VbeQ111 of the NPN transistor Q111 and the diodes D111 to D113 connected in series in the forward direction. Specifically, VbQ111 is the value as shown in the following expression.

$$VbQ111=Vref+(3\times Vf)+VbeQ111=Vref+(4\times Vf)$$

The symbol Vf denotes a forward voltage of a diode, and also corresponds to a base-emitter voltage Vbe of the NPN transistor Q111. The base-emitter voltage of any other NPN transistor also corresponds to Vf.

In the differential amplifier 120, the NPN transistors Q122 and Q123 together with the NPN transistors Q124 and Q125 that form a differential pair form a cascode connection, and each base of the NPN transistors Q122 and Q123 is connected to the node N126. Further, the NPN transistor Q121 is connected between the nodes N121 and N122. According to this configuration, the amplitude of the output of the differential amplifier 120, which is the input of the comparator 130 is limited, so as to achieve a high-speed operation in the differential amplifier 120.

Since the NPN transistors Q126 and Q111 have the common base, a base voltage VbQ126 of the NPN transistor Q126 is equal to the base voltage VbQ111 of the NPN transistor Q111. Thus, when a base-emitter voltage of the NPN transistor Q126 is denoted by VbeQ126 and the base voltages of the NPN transistors Q122, Q123 are respectively denoted by VbQ122 and VbQ123, the following expression is established.

$$VbQ122 = VbQ123 = VbQ126 - VbeQ126 =$$
$$VbQ111 - VbeQ111 = Vref + (4\times Vf) - Vf = Vref + (3\times Vf)$$

Accordingly, the voltage of the NPN transistors Q122 and Q123, which is the voltage of the node N126 is fixed to Vref+(3×Vf).

Further, a current IcQ127, which is the current that flows in a current path in which the NPN transistor Q126, the diode D121, the resistor 8123, and the NPN transistor Q127 are connected in series, is determined by the following expression.

$$IcQ127=(Vref+Vf)/R123$$

Now, the NPN transistors Q127 and Q128 and the NPN transistor Q151 of the pull-down circuit 150 constitute a current mirror circuit, where the NPN transistor Q127 functions as an input transistor. Thus, a constant current Io in accordance with the mirror ratio of the NPN transistor Q127 to the NPN transistor Q128 flows in the NPN transistor Q128 with respect to the current IcQ127. The constant current Io flows as the operational current of the differential pair transistors Q124 and Q125. The symbol attached to the resistor R123 also indicates the resistance value of the resistor. The symbols attached to other resistors also indicate the resistance values of the respective resistors. Further, the NPN transistor Q151 of the pull-down circuit 150 is also ON, and the constant current in accordance with the mirror ratio of the NPN transistor Q127 to the NPN transistor Q151 flows in the NPN transistor Q151 with respect to the current IcQ127.

In the pull-down circuit 150, the NPN transistor Q151 is ON as described above. Thus, the voltage of the node N151 decreases. Thus, the NPN transistor Q151 is OFF, and the connection of the ground terminal GND and the output terminal COUT102 of the comparator 130 is interrupted.

The voltages supplied to the differential input terminals Vin101 and Vin102 are denoted by V101 and V102, respectively. When V101>V102, the NPN transistor Q124 is ON and the NPN transistor Q125 is OFF. Thus, the voltages of the nodes N122 and N121 that are outputs of the differential amplifier 120, or voltages VCIN101 and VCIN102 of the input terminals CIN101 and CIN102 of the comparator 130 are expressed by the following expression.

$$VCIN101=VCC-R121\times Io$$

$$VCIN102=VCC$$

Hence, VCIN101<VCIN102 is satisfied.

As described above, inversion outputs of the input terminals CIN101 and CIN102 are output from the output terminals COUT101 and COUT102 of the comparator 130, respectively. When output voltages from the output terminals COUT101 and COUT102 are denoted by VCOUT101 and VCOUT102, respectively, VCOUT101>VCOUT102 is satisfied. In summary, the high-level signal is output from the output terminal COUT101 of the comparator 130 and the low-level signal is output from the output terminal COUT102.

Since the high-level signal is output from the output terminal COUT101, the NPN transistor Q141 turns on in the output stage circuit 140. Further, since the NPN transistor Q141 is ON, the voltage of the node N141 increases, which turns on the NPN transistor Q143. Further, since the NPN transistor Q143 is ON, the voltage of the node N143 decreases, which turns off the NPN transistor Q145 (low-side transistor).

On the other hand, since the low-level signal is output from the output terminal COUT102, the NPN transistor Q142 is OFF, the voltage of the node N142 reaches the power supply voltage VCC, and the NPN transistor Q144 (high-side transistor) is ON. Accordingly, the NPN transistor Q145 (low-side transistor) is OFF, the NPN transistor Q144 (high-side transistor) is ON, and the voltage of the output terminal VOUT is in the high level.

On the other hand, when V101<V102, the NPN transistor Q124 is OFF and the NPN transistor Q125 is ON. Accordingly, the voltages VCIN101 and VCIN102 of the input terminals CIN101 and CIN102 of the comparator 130 are as follows.

$$VCIN101=VCC$$

$$VCIN102=VCC-R122\times Io$$

Thus, VCIN101>VCIN102 is satisfied.

The inversion outputs of the input terminals CIN101 and CIN102 are output from the output terminals COUT101 and COUT102 of the comparator 130, respectively, where VCOUT101<VCOUT102 is satisfied. In summary, the low-level signal is output from the output terminal COUT101 of the comparator 130, and the high-level signal is output from the output terminal COUT102 thereof.

Since the low-level signal is output from the output terminal COUT101, the NPN transistor Q141 is OFF, the voltage of the node N141 drops to the ground voltage GND, and the NPN transistor Q143 is OFF in the output stage circuit 140.

Further, since the NPN transistor Q143 is OFF, the voltage of the node N143 increases, and the NPN transistor Q145 (low-side transistor) is ON.

On the other hand, the high-level signal is output from the output terminal COUT102. Thus, the NPN transistor Q142 is ON, the voltage of the node N142 drops, and the NPN transistor Q144 (high-side transistor) is OFF. Accordingly, the NPN transistor Q145 (low-side transistor) is ON, the NPN transistor Q144 (high-side transistor) is OFF, and the voltage of the output terminal VOUT is in the low level. Described above is the normal operation of the output circuit 100.

The output circuit 100 requires the power supply voltage VCC of the following voltage at least in order to normally operate the bias circuit 110.

$$VCC \geq Vref + (4 \times Vf)$$

Normally, when Vref=1 V and Vf=0.6 V, VCC≧3.4 V. The bias circuit 110 cannot operate with the power supply voltage VCC of this voltage value or less. In the following description, the operation of the output circuit 100 when the power supply voltage VCC is too low to operate the bias circuit 110 will be described. In such a low power supply voltage, the bias circuit 110 does not operate and the NPN transistor Q126 does not turn on. Thus, as in the normal operation state described above, the current IcQ127 cannot flow in the current path in which the NPN transistor Q126, the diode D121, the resistor R123, and the NPN transistor Q127 are connected in series, and the NPN transistor Q127 cannot turn on.

Since the NPN transistor Q127 is not ON, the NPN transistor Q151 of the pull-down circuit 150 cannot turn on as well. Thus, the node N151 and the ground terminal GND are electrically interrupted, the voltage of the node N151 increases up to the power supply voltage VCC, which is in the high level. Thus, the NPN transistor Q152 whose base is connected to the node N151 is ON, the ground terminal GND and the output terminal COUT102 of the comparator 130 are conducted, and the base voltage of the NPN transistor Q142 is fixed to the low level.

As a result, the NPN transistor Q142 is OFF, the node N142 is equal to the power supply voltage VCC, and the NPN transistor Q144 (high-side transistor) is ON. Accordingly, the NPN transistor Q145 (low-side transistor) is OFF, the NPN transistor Q144 (high-side transistor) is ON, and the voltage of the output terminal VOUT is fixed to the high level.

After that, when the power supply voltage VCC sufficiently increases to allow the bias circuit 110 to normally operate, the NPN transistor Q126 is ON, thereby allowing the normal operation as described above.

In the related output circuit 1, when the power supply voltage VCC is too low to operate a bias circuit 10, a constant current cannot be supplied to a differential amplifier 20 or a comparator 30. This makes each output of the comparator 30 high-impedance state and causes unstable voltage. Then, an output stage circuit 40 having a fewer number of stages of transistors starts up first, and an unstable signal may be output to a circuit that is located at the subsequent stage connected to an output terminal Vout due to the unstable input. Thus, if the subsequent circuit is in the middle of start-up or the subsequent circuit can operate with low voltage, the subsequent circuit may receive the unstable signal from the output terminal Vout and this causes malfunction, and may cause destruction of the subsequent circuit in the worst case.

In the prior art as in output circuits 2 and 3, in order to prevent the problem as in the output circuit 1, the voltage of the output signal is fixed by a pull-down circuit when the power supply voltage is low. In a pull-down circuit 50 of the output circuit 2, an NPN transistor Q51 is ON until when the voltage occurred in a resistor R53 reaches a base-emitter voltage VbeQ52 of an NPN transistor Q52 in a current path composed of a resistor R51, a diode D51, and a resistor R53.

The output circuit 2 fixes an output voltage VOUT by the operation of the pull-down circuit 50. However, the power supply voltage VCC to turn on the NPN transistor Q51 is independently determined regardless of the operations of the circuits other than the pull-down circuit 50. Thus, the pull-down circuit 50 may operate even with the lowest power supply voltage or the pull-down circuit 50 may not operate with the voltage of VCC of the normal operation or less depending on the manufacturing variations or fluctuations of the ambient temperature. Thus, the output circuit 2 may also output the unstable signal as is similar to the output circuit 1 described above.

Further, in the output circuit 2, the current path composed of the resistor R51, the diode D51, and the resistor R53 that are connected in series is arranged between the power supply voltage VCC and the ground terminal GND. Accordingly, the current according to the increasing power supply voltage constantly flows in the current path, which causes an increase in the power consumption in the circuit.

Furthermore, in the output circuit 3, in order to synchronize the operation timing of a pull-down circuit 60 and the timing of the signal output operation of the output circuit 3, one end of a resistor R62 is connected to a base of an NPN transistor Q71. Accordingly, the operation of the NPN transistor Q71 corresponds to the operation of the pull-down circuit 60, thereby preventing the operation timing of the pull-down circuit from being deviated as in the output circuit 2. However, as in the output circuit 2, the pull-down circuit 60 may not operate depending on the manufacturing variations or the fluctuations of the ambient temperature. Thus, the output circuit 3 may also output the unstable signal as in the output circuit 1 described above.

Furthermore, in the output circuit 3, a current path composed of resistors R71, R62, and R63 that are connected in series is arranged between the power supply voltage VCC and the ground terminal GND. Hence, the current according to the increasing power supply voltage constantly flows in the current path, which causes an increase in the power consumption in the circuit.

In the output circuit 100 according to the first exemplary embodiment, the operation to fix the output signal VOUT of the output stage circuit 140 is performed according to the current from the bias circuit 110 by the pull-down circuit 150. Accordingly, it is possible to perform the operation of fixing the output signal VOUT of the pull-down circuit 150 until when the bias circuit 110 starts the operation, which is the timing at which the power supply voltage is sufficient to allow the output circuit 100 to normally operate. After the power supply voltage is sufficient to allow the output circuit 100 to normally operate, the operation of fixing the output signal VOUT can be accurately stopped, so as to prevent the pull-down circuit 150 from being operated in an inappropriate period.

Further, the power consumed in the pull-down circuit 150 is the current that flows in the NPN transistor Q151 having a current mirror configuration, and is determined by the operational current of the bias circuit 110. Hence, the current value having no relation with an increase in the power supply voltage VCC can be maintained. Accordingly, the power consumption can be reduced.

Second Exemplary Embodiment

Figure 2:
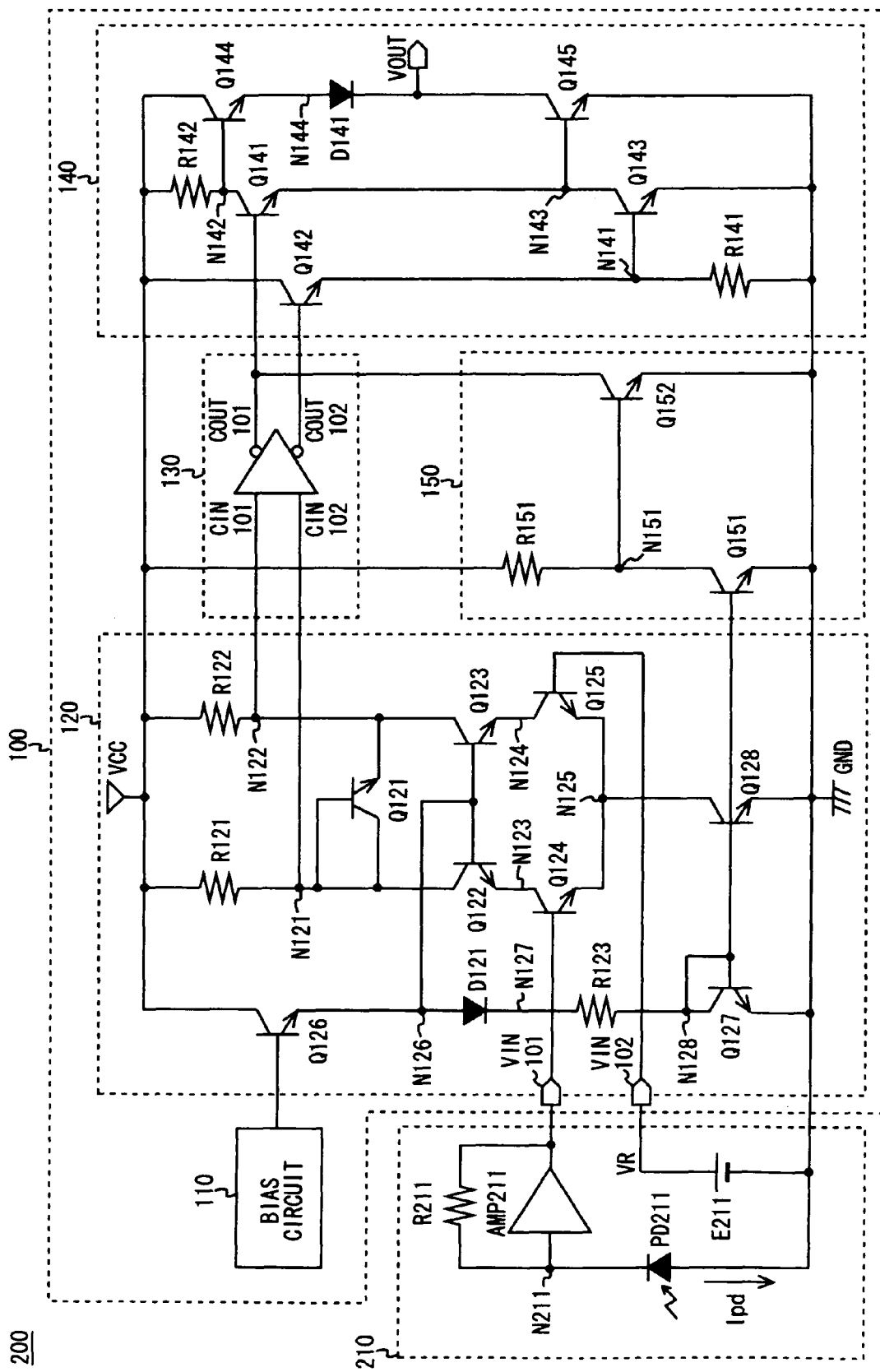
FIG. 2 shows a configuration of a light-receiver circuit according to a second exemplary embodiment.

A second exemplary embodiment according to the present invention will be described in detail with reference to the drawing. The second exemplary embodiment applies the present invention to a light-receiver circuit 200. FIG. 2 shows a configuration of the light-receiver circuit 200 according to the second exemplary embodiment. As shown in FIG. 2, the light-receiver circuit 200 includes a bias circuit 110, a differential amplifier 120, a comparator 130, an output stage circuit 140, a pull-down circuit 150, and a light-receiver amplifier 210.

The light-receiver amplifier 210 includes a photodiode PD211, a current/voltage conversion amplifier AMP211, a resistor R211, and a reference voltage circuit E211.

In FIG. 2, the same or similar components as those of FIG. 1 are denoted by identical reference numerals. The second exemplary embodiment is different from the first exemplary embodiment in that the light-receiver amplifier 210 is combined with the output circuit 100 to form the light-receiver circuit 200. More specifically, an output of the current/voltage conversion amplifier AMP211 is input to the differential input terminal VIN101 of the output circuit 100 and a reference voltage VR output from the reference voltage circuit E211 is input to the differential input terminal VIN102. The other structures are similar to those in the first exemplary embodiment, and the overlapping description will be omitted.

The photodiode PD211 is connected between a node N211 and the ground terminal GND. Upon receiving a light signal, the photodiode PD211 outputs a photocurrent Ipd according to the light signal.

The current/voltage conversion amplifier AMP211 has an input terminal connected to the node N211, and an output terminal connected to the differential input terminal VIN101. The current/voltage conversion amplifier AMP211 converts the photocurrent Ipd from the photodiode PD211 to a voltage.

The resistor R211 has one end connected to the node N211, and the other end connected to the differential input terminal VIN101. The resistor R211 is a feedback resistor to the current/voltage conversion amplifier AMP211, and determines a current/voltage conversion rate of the current/voltage conversion amplifier AMP211.

The reference voltage circuit E211 is connected between the differential input terminal VIN102 and the ground terminal GND. The reference voltage circuit E211 outputs the reference voltage VR to the differential input terminal VIN102.

An operation of the light-receiver amplifier 210 is as follows. When a light signal is input to the photodiode PD211, the photocurrent Ipd according to the input intensity of the light signal is generated. The current/voltage conversion amplifier AMP211 outputs the voltage Va of (Ipd×R507) to the differential input terminal VIN101. Further, the reference voltage circuit E211 outputs the reference voltage VR to the differential input terminal VIN102.

While the reference voltage VR is fixed, the voltage Va varies according to the input intensities of the light signal. When Va>VR is satisfied, the operation is similar to that when V101>V102 described in the first exemplary embodiment; when Va<VR is satisfied, the operation is similar to that when V101<V102 described in the first exemplary embodiment. Further explanation will be omitted.

The similar effect as in the first exemplary embodiment can be attained by applying the present invention to the light-receiver circuit 200 of the second exemplary embodiment. Note that the reference voltage VR output from the reference voltage circuit E211 may be supplied to the differential input terminal VIN101 of the output circuit 100 and the output of the current/voltage conversion amplifier AMP211 may be supplied to the differential input terminal VIN102. However, in this case, the logic of the input and the output of the output circuit 100 is inverted.

Third Exemplary Embodiment

Figure 3:
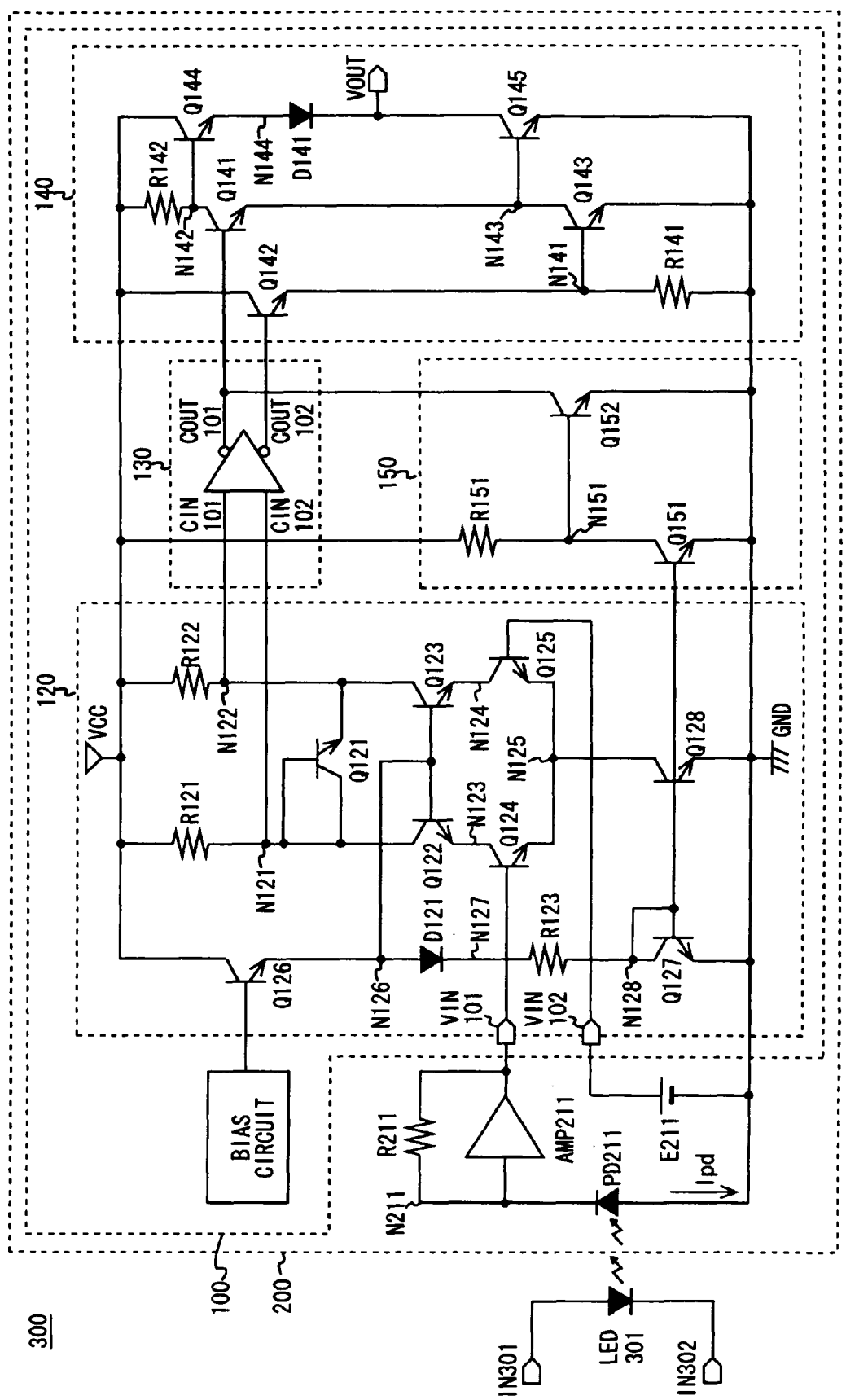
FIG. 3 shows a configuration of a photocoupler circuit according to a third exemplary embodiment.

Hereinafter, a third exemplary embodiment according to the present invention will be described in detail with reference to the drawings. The third exemplary embodiment applies the present invention to a photocoupler circuit. FIG. 3 shows a configuration of a photocoupler circuit 300 according to the third exemplary embodiment. As shown in FIG. 3, the photocoupler circuit 300 includes a bias circuit 110, a differential amplifier 120, a comparator 130, an output stage circuit 140, a pull-down circuit 150, a light-receiver amplifier 210, and a light-emitting diode LED 301.

In FIG. 3, the same or similar components as those of FIG. 2 are denoted by identical reference numerals. The third exemplary embodiment is different from the second exemplary embodiment in that the input light signal of a photodiode PD211 is supplied by the light-emitting diode LED 301. The other structures are similar to those in the second exemplary embodiment, and thus the overlapping description will be omitted.

The light-emitting diode LED 301 is connected between signal input terminals IN301 and IN302. The light-emitting diode LED 301 emits light according to electrical signals input to the signal input terminals IN301 and IN302, and transmits data to the photodiode PD211 of the light-receiver circuit 200.

The electrical signals input to the signal input terminals IN301 and IN302 may include current signals or voltage signals generated by resistors connected in series between the signal input terminals IN301 and IN302. By switching the light-emitting diode LED301 between the light emitting mode and the non-light emitting mode according to the current signals, a photocurrent Ipd according to the mode flows through the photodiode PD211. The subsequent operations are the same as those in the second exemplary embodiment, and the description thereof will be omitted.

By enclosing a primary side including the light-emitting diode LED 301 and a secondary side including a light-receiver circuit 200 to which the photodiode PD211 is added in one package, only signals may be transmitted between the primary side and the secondary side while electrically insulating the two sides. According to such a configuration, the photocoupler circuit 300 may be formed.

As described above, the similar effect as in the first and second exemplary embodiments can be attained even when the present invention is applied to the photocoupler circuit 300 according to the third exemplary embodiment.

Figure 4:
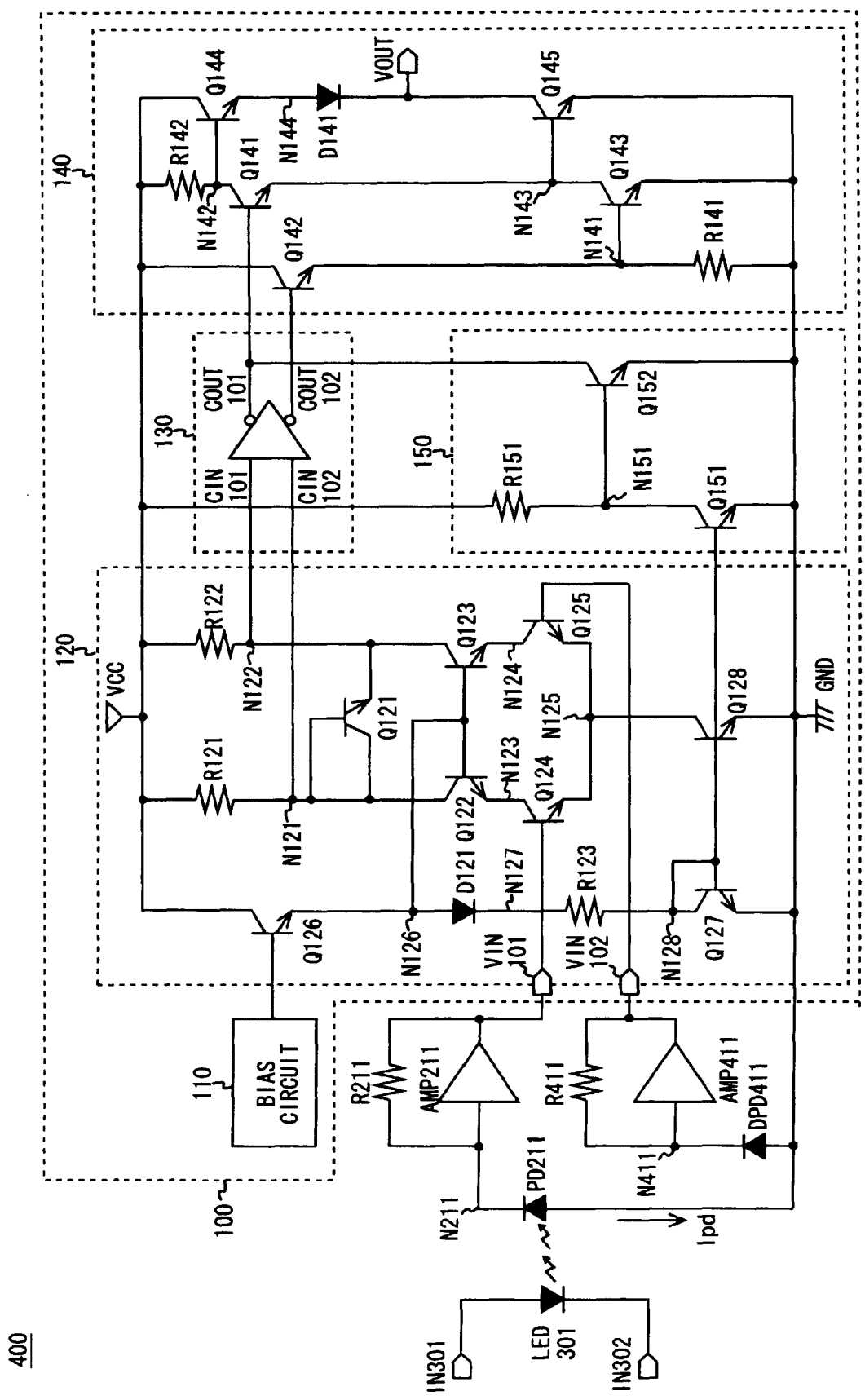
FIG. 4 shows another configuration of the photocoupler circuit according to the third exemplary embodiment.
Figure 5:
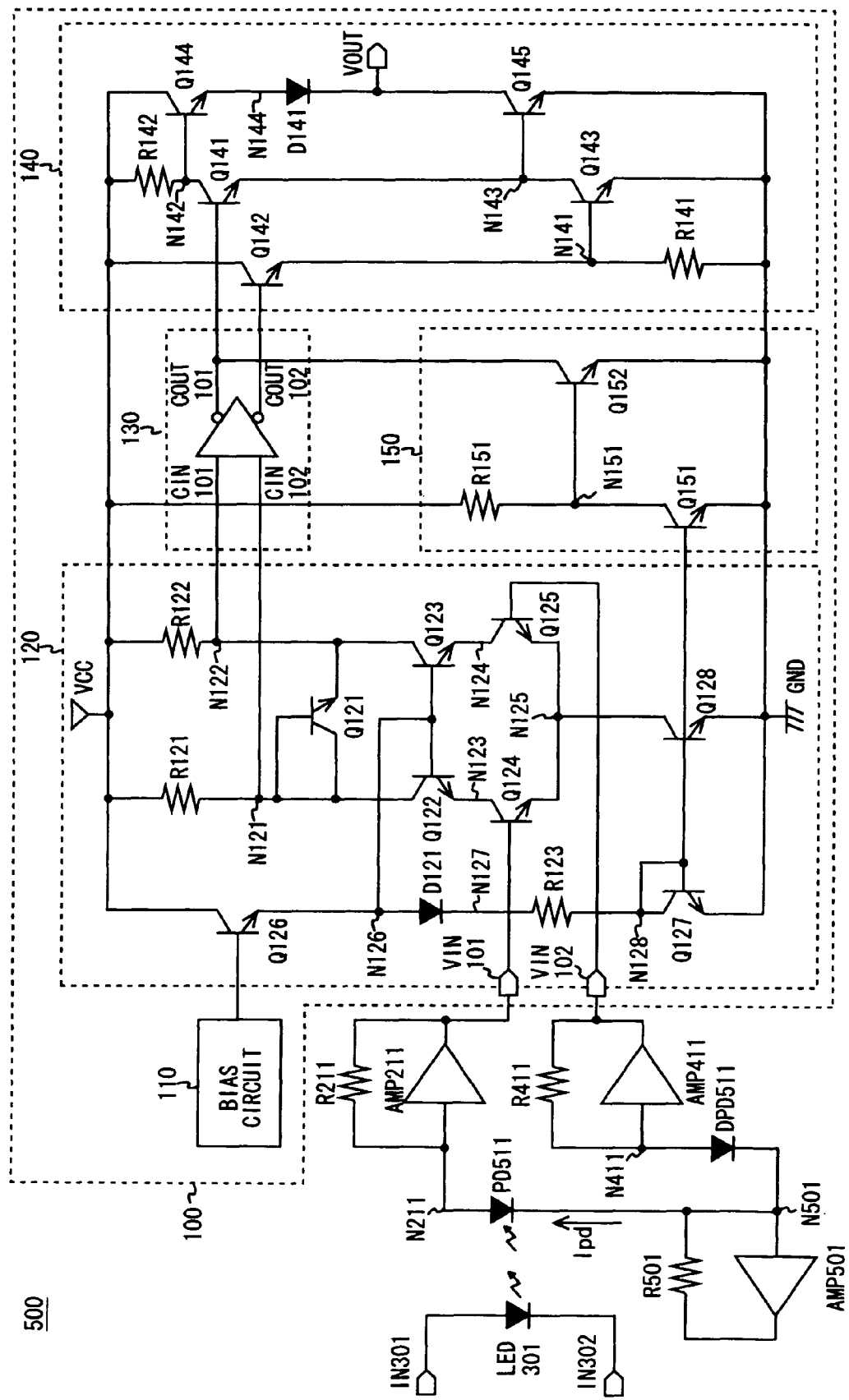
FIG. 5 shows another configuration of the photocoupler circuit according to the third exemplary embodiment.
Figure 6:
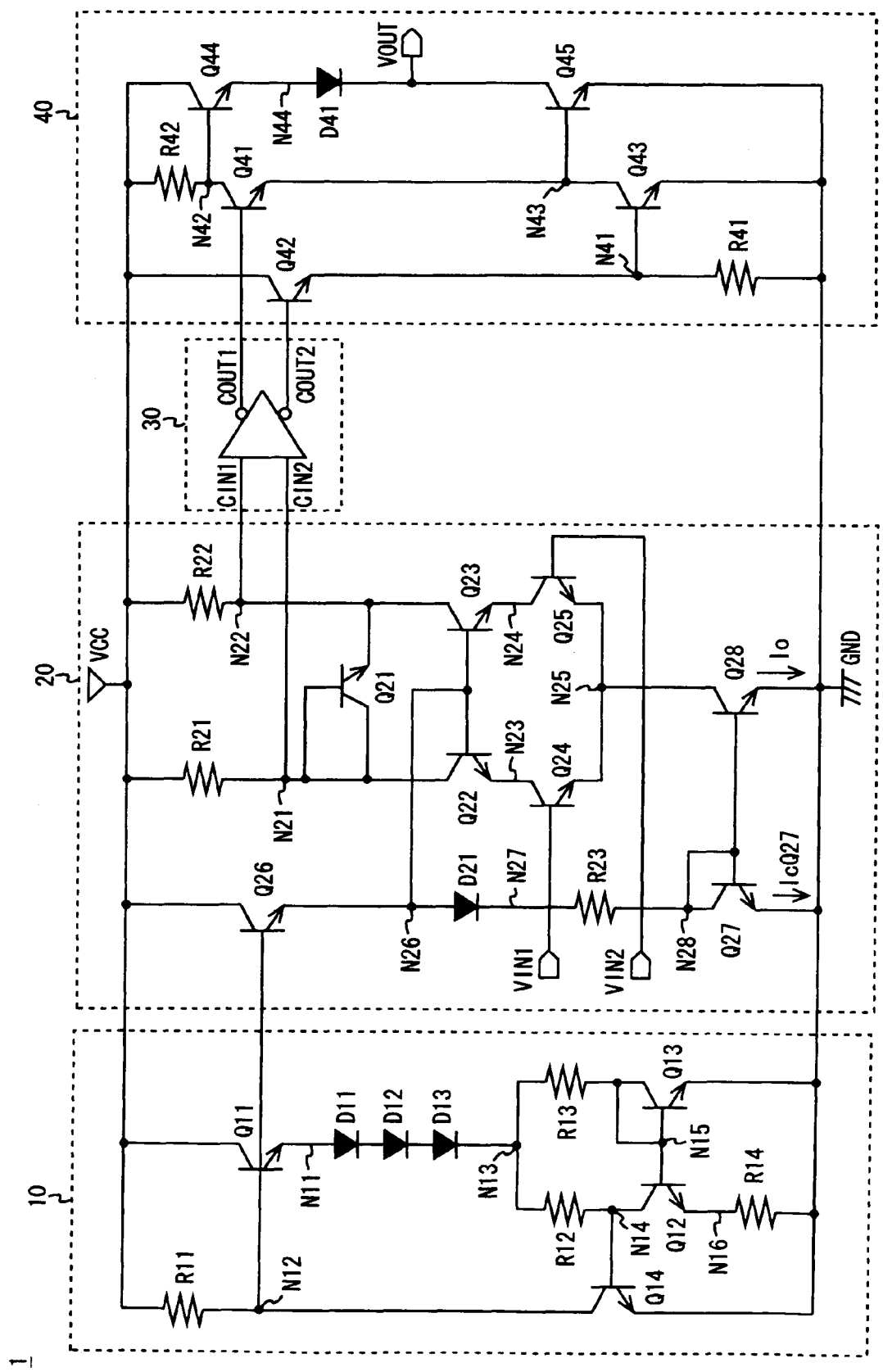
FIG. 6 shows a configuration of an output circuit according to a related art.
Figure 7:
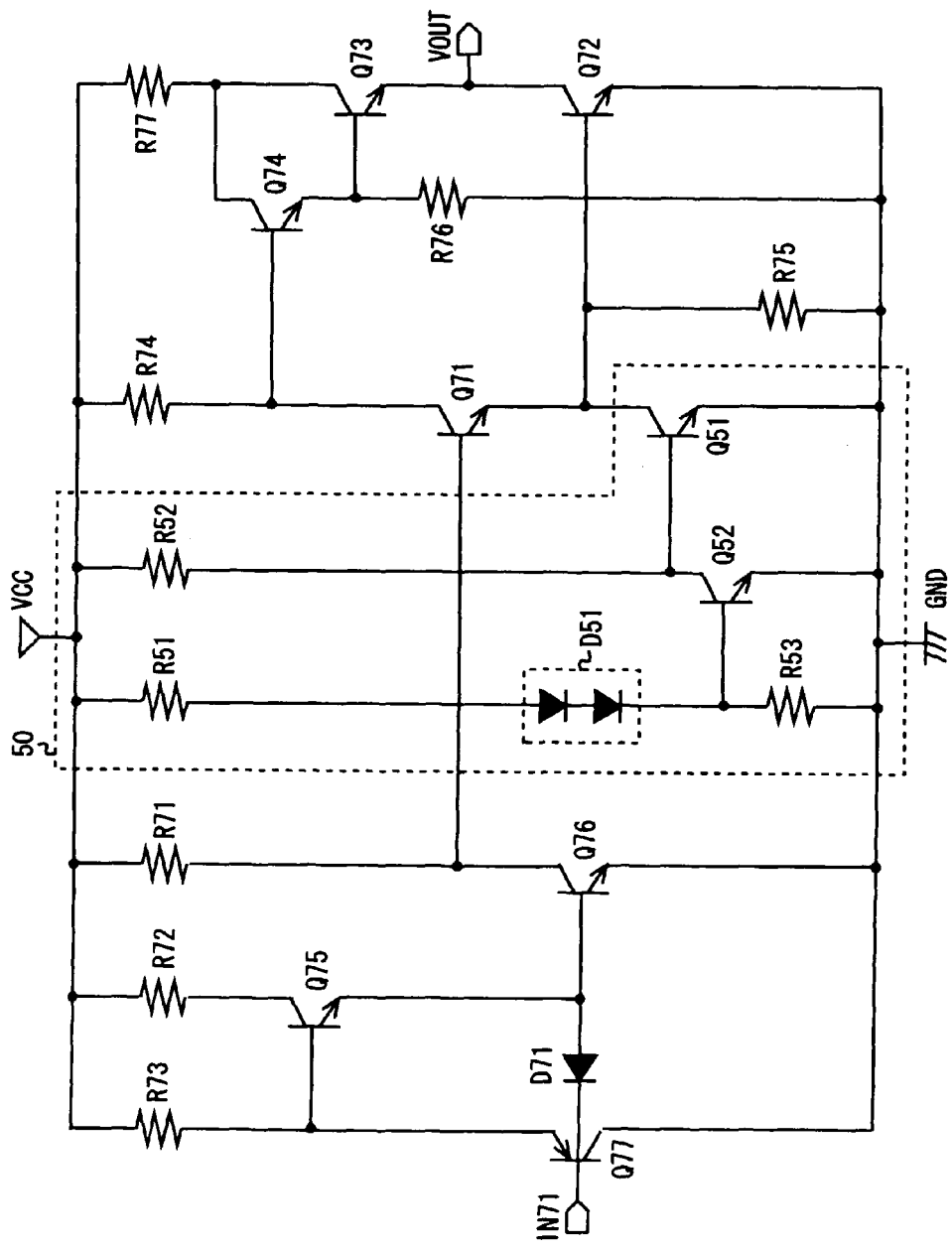
FIG. 7 shows a configuration of an output circuit according to a prior art.
Figure 8:
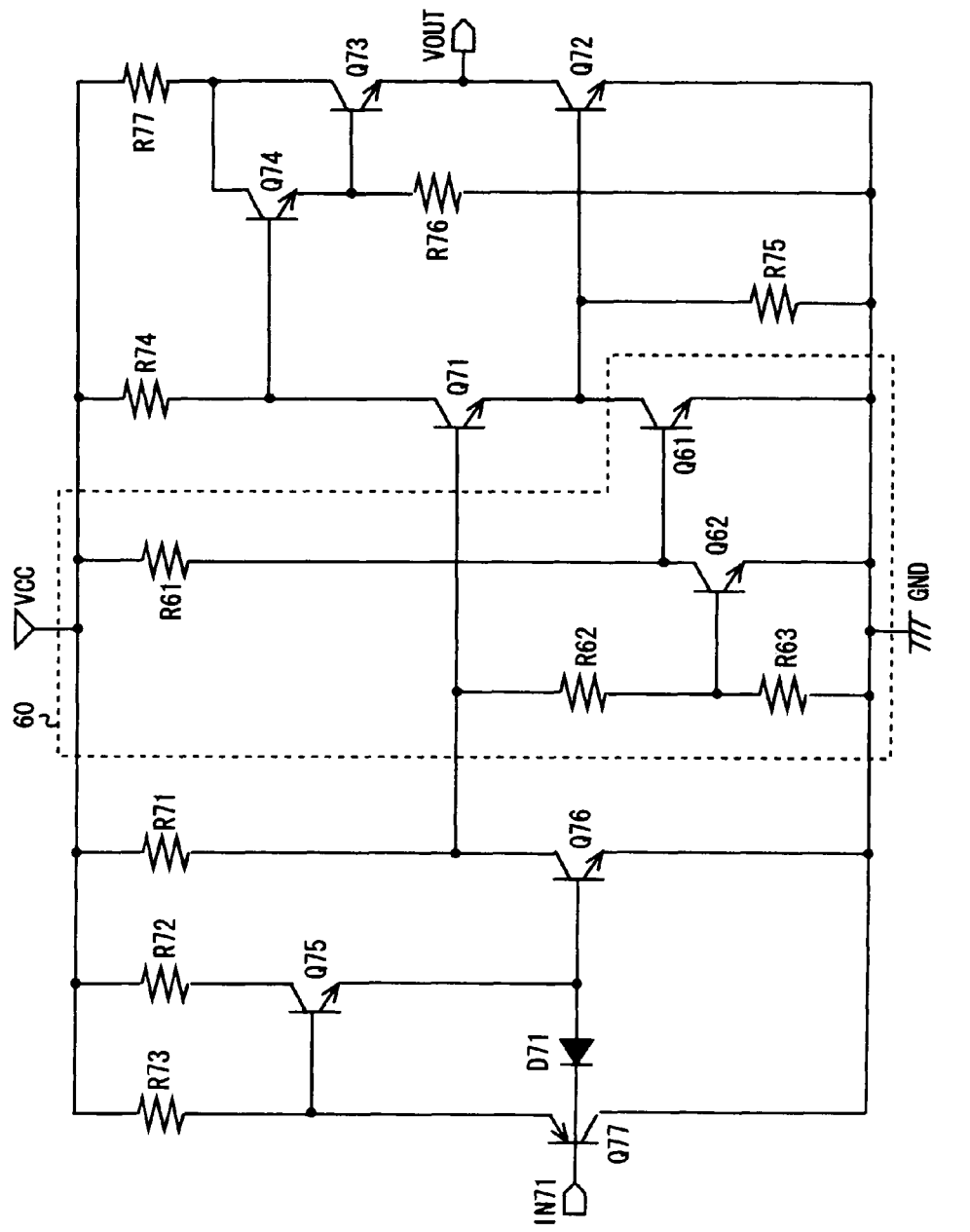
FIG. 8 shows a configuration of an output circuit according to a prior art.

Alternatively, the photocoupler circuit 300 may have other configurations as photocoupler circuits 400 and 500 as shown in FIGS. 4 and 5.

The photocoupler circuit 400 shown in FIG. 4 includes a dummy photodiode DPD 411, a current/voltage conversion amplifier AMP411, and a resistor R411 instead of the reference voltage circuit E211.

The dummy photodiode DPD 411 is connected between a node N411 and the ground terminal GND. The dummy photodiode DPD 411 has the same size and the structure as the photodiode PD211 that outputs the photocurrent Ipd. The dummy photodiode DPD 411 has the structure in which light shield is applied by aluminum or the like on the surface so that the photocurrent Ipd is not generated even when the light-emitting diode LED 301 emits light.

The current/voltage conversion amplifier AMP411 has an input terminal connected to the node N411, and an output terminal connected to the differential input terminal VIN102. The structure of the current/voltage conversion amplifier AMP411 is similar to that of the current/voltage conversion amplifier AMP211. The resistor R411 has one end connected to the node N411, and the other end connected to the differential input terminal VIN102. The resistor R411 has the same structure as the resistor R211 (same resistance value and manufacturing process). The light-emitting diode LED 301 is in the primary side as is similar to the photocoupler circuit 300, and the dummy photodiode DPD 411, the current/voltage conversion amplifier AMP411, and the resistor R411 are included in the secondary side.

The basic operation of the photocoupler circuit 400 having the configuration as stated above is similar to that of the photocoupler circuit 300. When noise is applied to the secondary side for some reasons, the operation of the circuit that includes the dummy photodiode DPD 411, the current/voltage conversion amplifier AMP411, and the resistor R411 is equal to the operation of the circuit that includes the photodiode PD211, the current/voltage conversion amplifier AMP211, and the resistor R211, and the noise can be cancelled in the differential amplifier 120. Hence, the malfunction in the photocoupler circuit 400 can be prevented. The cause of the noise applied to the secondary side may include fluctuations of the power supply voltage VCC, or the influence on the secondary side by the voltage fluctuations in the primary side, since the part between the primary side and the secondary side functions as a capacitor.

The photocoupler circuit 500 shown in FIG. 5 includes a photodiode PD511 instead of using the photodiode PD211 of the photocoupler circuit 400. The photodiode PD211 and the photodiode PD511 are different in the following point.

First, the photodiode PD211 constitutes PN junction of an epitaxial layer (N layer) and a substrate base (P layer). The anode side is the substrate base, and the anode is connected to the ground terminal GND as shown in FIGS. 2 to 4. On the other hand, the photodiode PD511 constitutes PN junction by diffusing the P layer in the upper part of the epitaxial layer (N layer). Hence, both of the anode and cathode may be used without being connected to the ground terminal GND or the ground voltage GND.

Thus, as shown in FIG. 5, the cathode of the photodiode PD511 may be connected to a node N501, and an amplifier AMP501 connected to a feedback resistor R501 may be connected to the node N501. In this case, a dummy photodiode DPD511 having the same configuration as the photodiode PD511 is used instead of using the dummy photodiode DPD 411.

Note that the present invention is not limited to the exemplary embodiments described above, but may be changed as appropriate without departing from the spirit of the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first to third exemplary embodiments can be combined as desirable by one of ordinary skill in the art.

What is claimed is:

1. An output circuit comprising:
   a bias circuit that operates when a power supply voltage equal to or larger than a predetermined voltage is applied;
   a differential amplifier circuit that outputs signals according to input differential signals upon receiving a bias current or a bias voltage generated when the bias circuit is operated;
   an output stage circuit that receives differential signals according to an output from the differential amplifier circuit and outputs output signals according to the differential signals, the output stage circuit having fewer number of stages of elements connected in series than the bias circuit; and
   a pull-down circuit that forcibly sets a level of one of the differential signals received by the output stage circuit to a ground voltage to fix the level of the output signals output from the output stage circuit when the bias current or the bias voltage generated by the bias circuit is not supplied.

2. The output circuit according to claim 1, wherein
   the pull-down circuit comprises first and second transistors, and a first resistor,
   the first transistor is connected between an input terminal of the output stage circuit that receives one of the differential signals according to the output from the differential amplifier circuit and a ground terminal supplying a ground voltage, the first transistor having a control terminal connected to a first node,
   the first resistor is connected between the first node and a power supply terminal supplying a power supply voltage, and
   the second transistor is connected between the first node and the ground terminal, the second transistor being OFF when the bias current or the bias voltage generated by the bias circuit is not supplied, the second transistor flowing a current according to the bias current or the bias voltage when the bias current or the bias voltage generated by the bias circuit is supplied.

3. The output circuit according to claim 1, wherein the output stage circuit comprises a first conductive type third transistor connected between the power supply terminal and an output node and a first conductive type fourth transistor connected between the output node and the ground terminal, the output stage circuit driving a load connected to the output node by the third and fourth transistors alternately switching between an ON state and an OFF state according to received signals.

4. The output circuit according to claim 3, wherein
   the output stage circuit further comprises fifth to seventh transistors, and second and third resistors,
   a control terminal of the third transistor is connected to a second node,
   a control terminal of the fourth transistor is connected to a third node,
   the second resistor is connected between the power supply terminal and the second node,
   the fifth transistor is connected between the second node and the third node, the fifth transistor having a control terminal to which one of the differential signals received by the output stage circuit is input,
   the sixth transistor is connected between the third node and the ground terminal, the sixth transistor having a control terminal connected to a fourth node,
   the seventh transistor is connected between the power supply terminal and the fourth node, the seventh transistor having a control terminal to which the other of the differential signals received by the output stage circuit is input, and the third resistor is connected between the fourth node and the ground terminal.

5. The output circuit according to claim 1, wherein the differential amplifier circuit comprises:
- a first current path and a second current path, the first current path comprising a fourth resistor and an eighth transistor connected in series between the power supply terminal and a fifth node, the second current path comprising a fifth resistor and a ninth transistor connected in series between the power supply terminal and the fifth node; and
- a tenth transistor that is connected between the fifth node and the ground terminal, the tenth transistor supplying a drive current to the first and the second current paths,
- a control terminal of the eighth transistor is connected to a first input terminal that receives one of the input differential signals,
- a control terminal of the ninth transistor is connected to a second input terminal that receives the other of the input differential signals,
- signals according to the input differential signals are output from a first intermediate node between the fourth resistor and the eighth transistor and from a second intermediate node between the fifth resistor and the ninth transistor, and
- the tenth transistor is OFF when the bias current or the bias voltage generated by the bias circuit is not supplied, and the tenth transistor flows a current according to the bias current or the bias voltage as the drive current when the bias current or the bias voltage generated by the bias circuit is supplied.

6. The output circuit according to claim 5, wherein the differential amplifier circuit further comprises:
- eleventh and twelfth transistors that are connected in series between the power supply terminal and the ground terminal;
- a thirteenth transistor that is connected between the first intermediate node and the eighth transistor; and
- a fourteenth transistor that is connected between the second intermediate node and the ninth transistor;
- control terminals of the thirteenth and fourteenth transistors are connected to a third intermediate node of the eleventh and twelfth transistors,
- the eleventh transistor is OFF when the bias current or the bias voltage generated by the bias circuit is not supplied, and the eleventh transistor flows a current according to the bias current or the bias voltage when the bias current or the bias voltage generated by the bias circuit is supplied, and
- the twelfth transistor flows a current according to a current flowed by the eleventh transistor.

7. The output circuit according to claim 6, wherein the differential amplifier circuit further comprises a fifteenth transistor connected between the first and the second intermediate nodes, and
a control terminal of the fifteenth transistor is connected to the first intermediate node.

8. The output circuit according to claim 7, wherein the first to fifteenth transistors have the same conductive type.

9. A light-receiver circuit comprising:
the output circuit according to claim 5;
a photodiode that flows a photocurrent according to a light input signal; and
a first current/voltage conversion amplifier circuit that outputs a voltage signal according to the photocurrent,
wherein one of input differential signals input to the differential amplifier circuit is a voltage signal output from the first current/voltage conversion amplifier circuit.

10. The light-receiver circuit according to claim 9, comprising:
a reference voltage generation circuit that outputs a predetermined reference voltage,
wherein the other of the input differential signals input to the differential amplifier circuit is a reference voltage output from the reference voltage generation circuit.

11. The light-receiver circuit according to claim 9, further comprising:
a dummy photodiode that has the same configuration as the photodiode and a second current/voltage conversion amplifier circuit that has the same configuration as the first current/voltage conversion amplifier circuit, wherein
the photodiode is connected between a ground terminal and an input terminal of the first current/voltage conversion amplifier circuit,
the first current/voltage conversion amplifier circuit is connected in parallel with a first feedback resistor, and an output terminal of the first current/voltage conversion amplifier circuit is connected to a first input terminal that receives one of input differential signals of the output circuit,
the dummy photodiode is connected between the ground terminal and an input terminal of the second current/voltage conversion amplifier circuit, and
the second current/voltage conversion amplifier circuit is connected in parallel with a second feedback resistor, and an output terminal of the second current/voltage conversion amplifier circuit is connected to a second input terminal that receives the other of the input differential signals of the output circuit.

12. The light-receiver circuit according to claim 9, further comprising:
a first amplifier circuit, a dummy photodiode that has the same configuration as the photodiode and a second current/voltage conversion amplifier circuit that has the same configuration as the first current/voltage conversion amplifier circuit, wherein
the photodiode is connected between a sixth node and an input terminal of the first current/voltage conversion amplifier circuit,
the first current/voltage conversion amplifier circuit is connected in parallel with a first feedback resistor, and an output terminal of the first current/voltage conversion amplifier circuit is connected to a first input terminal that receives one of input differential signals of the output circuit,
the dummy photodiode is connected between the sixth node and an input terminal of the second current/voltage conversion amplifier circuit,
the second current/voltage conversion amplifier circuit is connected in parallel with a second feedback resistor, and an output terminal of the second current/voltage conversion amplifier circuit is connected to a second input terminal that receives the other of the input differential signals of the output circuit, and the first amplifier circuit is connected in parallel with a third feedback resistor, and input/output terminals of the first amplifier circuit are connected to the sixth node.

13. A photocoupler circuit comprising:
the light-receiver circuit according to claim 9; and
a light-emitting diode that emits an input light signal received by a photodiode according to an input electric signal.

* * * * *